United States Patent [19]

Bauer et al.

[11] Patent Number: 5,120,629
[45] Date of Patent: Jun. 9, 1992

[54] POSITIVE-WORKING PHOTOSENSITIVE ELECTROSTATIC MASTER

[75] Inventors: Richard D. Bauer, Kennett Square, Pa.; Catherine T. Chang, Wilmington, Del.

[73] Assignee: E. I. du Pont de Nemours and Company, Wilmington, Del.

[21] Appl. No.: 507,338

[22] Filed: Apr. 10, 1990

[51] Int. Cl.$^5$ .............................. G03G 5/00
[52] U.S. Cl. ......................... 430/70; 430/75; 430/56; 430/270
[58] Field of Search .................. 430/75, 70, 56, 270, 430/69

[56] References Cited

U.S. PATENT DOCUMENTS

| | | | |
|---|---|---|---|
| 3,408,186 | 10/1968 | Nammino | 430/56 |
| 3,600,169 | 8/1971 | Lawton | 430/75 |
| 4,111,692 | 9/1978 | Etoh et al. | 96/1 R |
| 4,491,628 | 1/1985 | Ito et al. | 430/270 |
| 4,552,833 | 11/1985 | Ito et al. | 430/270 |
| 4,661,429 | 4/1987 | Molaire et al. | 430/70 |
| 4,732,831 | 3/1988 | Riesenfeld et al. | 430/49 |
| 4,837,124 | 6/1989 | Wu et al. | 430/270 |
| 4,945,020 | 7/1990 | Kempf et al. | 430/49 |
| 4,985,332 | 1/1991 | Anderson et al. | 430/176 |
| 4,996,136 | 2/1991 | Houlihan et al. | 430/270 |

*Primary Examiner*—Marion E. McCamish
*Assistant Examiner*—Christopher D. RoDee

[57] ABSTRACT

High resolution photosensitive electrostatic master which forms conductive exposed image areas upon imagewise exposure comprising an electrically conductive substrate bearing a photosensitive layer consisting essentially of at least one acid labile compound which decomposes to form acid, and a photoinitiator or photoinitiating system which upon exposure generates a catalytic amount of a strong acid. A xeroprinting process from producing positive images in said photosensitive layer of the master is also disclosed. The master is useful in the graphic arts field. e.g., making color proofs, preparation of printing circuit boards, resists, solder masks, etc.

22 Claims, No Drawings

POSITIVE-WORKING PHOTOSENSITIVE ELECTROSTATIC MASTER

TECHNICAL FIELD

This invention relates to a photosensitive element for use as an electrostatic master. More particularly this invention relates to a photosensitive electrostatic master capable of producing positive images from a single exposure wherein an electrically conductive substrate has coated on it a layer of photosensitive composition consisting essentially of an acid labile organic compound which forms acid in combination with a photoinitiator or photoinitiating system which upon exposure generates a catalytic amount of strong acid.

BACKGROUND OF THE INVENTION

Photopolymerizable compositions and films containing binder, monomer, initiator and chain transfer agent are described in the prior art and sold commercially. One important application of photopolymerizable layers is in graphic arts. Photopolymerizable layers are currently being used as electrostatic masters for analog color proofing and are considered as promising future materials to be developed for digital color proofing applications. For the analog color proofing application, a photopolymerizable layer is coated on an electrically conductive substrate to form an element and contact exposed with an ultraviolet (UV) source through a half tone color separation negative. The photopolymerizable layer hardens in the areas exposed with the UV source due to polymerization and remains in an unexposed liquid-like state elsewhere. The differences in viscosity between the exposed and unexposed areas are apparent in the transport properties, i.e., the unexposed photopolymerizable areas conduct electrostatic charge while the UV exposed areas are nonconductive. By subjecting the exposed photopolymerizable element to a corona discharge a latent electrostatic image is obtained consisting of electrostatic charge remaining only in the nonconducting or exposed areas of the layer. This latent image can then be developed by application of an electrostatic toner or developer to the surface. When the toner or developer has the opposite charge as the corona charge, the toner or developer selectively adheres to the exposed or polymerized areas of the photopolymerizable element.

Photohardenable electrostatic masters are needed that duplicate the imaging characteristics of a printing press. Such masters wherein the conductivity of both the exposed and unexposed areas can be controlled by introducing into a photopolymerizable composition an electron donor or an electron acceptor molecule that modify the electrical properties of the composition and provides the dot gain similar to that achieved by a printing press are known.

Although the use of photopolymers in electrophotography has been demonstrated and many formulations can be imaged, it did not appear possible, to produce a photopolymerizable or photohardenable electrostatic master that was capable of producing both positive and negative images. Photohardenable elements which have a conductive support bearing a photohardenable layer comprising a polymeric binder, a compound having at least one ethylenically unsaturated group, an initiator, a photoinhibitor and at least one sensitizing compound overcome the problem. These layers containing a photoinhibitor and a sensitizer compound are capable of producing positive and negative images depending on the exposure sequence and exposure wavelength. Such elements are extremely useful because a single element will satisfy the proofing needs of all printers regardless of whether they work with negative or positive color separations. A problem with these elements is that they require two exposures to provide a positive-working electrostatic master. Using the photosensitive element of this invention, which is not photohardenable, only one exposure is needed to provide a positive-working electrostatic master.

Several positive-working photosensitive electrostatic elements which also need only one exposure have been developed. In one such element the photosensitive layer has a composition consisting essentially of (A) at least one organic polymeric binder, (B) a hexaarylbiimidazole photooxidant, (C) a leuco dye oxidizable to an ionic species by the photooxidant, (D) a nonionic halogenated compound, and (E) a compatible plasticizer. While this photosensitive electrostatic master provides good results, it requires at least five components. The photosensitive layer of another such element generates sufficient acid directly on exposure to render the exposed areas conductive. While at least 1% by weight acid former must be used a preferred range of acid former is from 10 to 60% by weight. It has been found that using relatively less acid former can result in lower photospeed. It has subsequently been found that the ability of the unexposed element to hold charge at working humidities of 20% R.H. or more decreases fairly rapidly as the amount of onium salt acid former, e.g., triarylsulfonium hexafluoroantimonate salt, increases above 3% by weight based on the weight of the photosensitive layer. Also it is known that higher levels of onium salt initiators may not be completely compatible with the other components of the photosensitive elements.

It has now been found that in a photosensitive system containing an acid labile organic compound which decomposes to form acid only a catalytic amount of strong acid needs to be formed by an initiator on direct exposure. Charge decay occurs in the exposed image areas after a chemical amplification step occurs in which the catalytic acid decomposes the acid labile organic compound into sufficient free acid to render the exposed image areas conductive. This photosensitive system results not only in higher photospeed but significantly greater latitude in formulating the relatively nonconductive photosensitive layer, e.g., particularly when onium salts are used as the acid forming initiator.

SUMMARY OF THE INVENTION

In accordance with this invention there is provided a high resolution, photosensitive electrostatic master which upon imagewise exposure forms conductive exposed image areas, the photosensitive electrostatic master comprising an electrically conductive substrate bearing a layer of a photosensitive composition consisting essentially of at least one acid labile compound which decomposes to form acid, and a photoinitiator or photoinitiating system which upon exposure to actinic radiation generates a catalytic amount of a strong acid.

In accordance with another embodiment of this invention there is provided a xeroprinting process for forming positive images comprising:

(1) exposing imagewise to actinic radiation a photosensitive electrostatic master comprising an electrically conductive substrate bearing a layer of a photosensitive composition consisting essentially of at least one acid labile compound which decomposes to form acid, and a photoinitiator or photoinitiating system which upon exposure to actinic radiation generates a catalytic amount of a strong acid (2) charging the photosensitive master electrostatically to form a latent image of electrostatic charge in the unexposed areas, (3) applying to the charged photosensitive master an oppositely charged electrostatic toner, and optionally (4) transferring the toned image to a receptor surface.

DETAILED DESCRIPTION OF THE INVENTION

This invention is based on the discovery that photosensitive compositions containing at least one acid labile organic compound which decomposes to form an acid, and a photoinitiator or photoinitiating system which upon exposure generates a catalytic amount of strong acid, said compositions when coated on conductive supports are capable of producing positive images with a single exposure. The exposure generates a catalytic amount of a strong acid preferably having a pKa equal to or less than 2. Optionally, there may also be present in the photosensitive layer non-acid labile plasticizers, non-acid labile polymeric binders, sensitizers, colorants, co-initiators, thermal stabilizers, charge carriers, etc.

Resistivity in the exposed areas should be between $10^{12}$ and $10^{15}$ ohm-cm and the ratio of resistivity in unexposed areas to resistivity in the exposed areas should be at least 100.

Examples of acid labile compounds (1) which form acids include:

(1a) polymers having acrylic, vinyl, polyester, and polyurethane backbones and acid labile carboxylic esters such as alpha-alkoxy alkyl, e.g., tetrahydropyranyl, secondary or tertiary alkyl, e.g., tert-butyl or isobornyl, and silyl; and acid labile esters of other acids, e.g., sulfonic or sulfinic acids;

(1b) plasticizers and other additives with acid labile esters like those described in (1a);

(1c) polymers in which the backbone is acid labile and decomposes to form acid, and (1d) polymers in which the backbone has acid labile crosslinks which form acid.

1a Polymers with Acid Labile Groups

1. Acrylic Polymer Backbone with pendant alpha-alkoxy alkyl esters

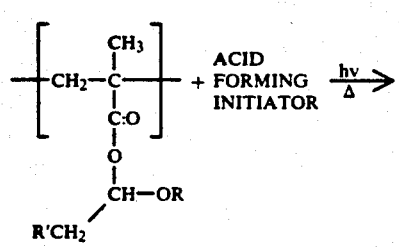

-continued

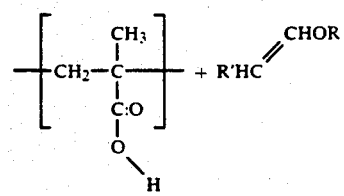

e.g., 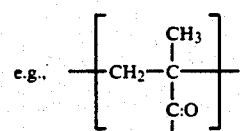 TETRAHYDROPYRANYL ESTER

DIHYDROPYRAN

R = H or alkyl;

R' = H or alkyl, wherein R and R', when taken together form a 5-, 6-, 7-membered ring.

2. Acrylic Polymer Backbone with pendant secondary or tertiary alkyl esters

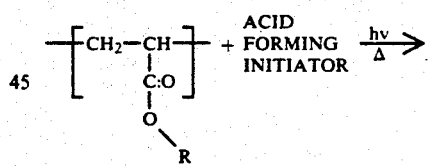

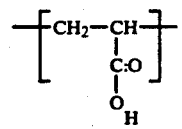

e.g., R = 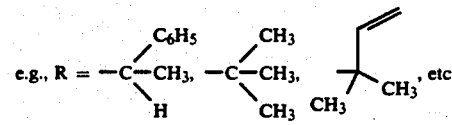, etc.

REF: Ito, Willson, Frechet U.S. Pat. No. 4,491,628

3. Vinyl Polymer Backbone with pendant alpha-alkoxy alkyl esters, secondary or tertiary alkyl esters,

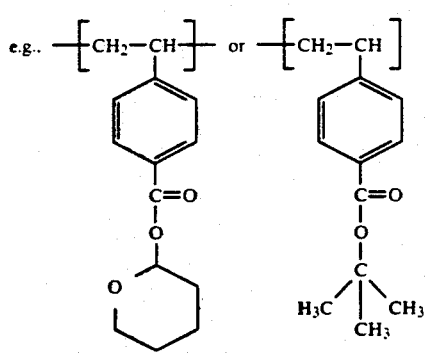

REF: BRUNSVOLD, ET AL., EPA 87 10 86 44.3 16.06.87, PUB. No. 254853

4. Acrylic Polymer Backbone with pendant silyl ester

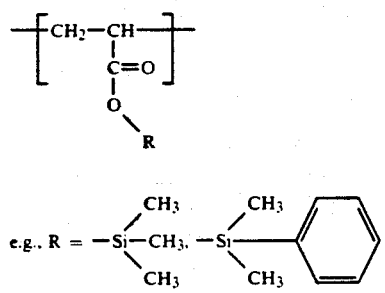

REF: Aoai, U.S. Pat. No. 4,820,607

1b Plasticizers and Other Additives with Acid Labile Groups

1. Acid Labile Ester of a non-polymeric carboxylic acid which is an additive or a plasticizer in the positive acting coating

wherein R can be alkyl ($C_1$-$C_{12}$), aryl ($C_6$-$C_{30}$), substituted alkyl, substituted aryl, wherein the substituents are alkoxy, ester, etc.,

$R^1$ can be any of the acid labile groups (1a) as in 1,2,3,4 above

2. Acid Labile Ester of a Sulfinic Acid

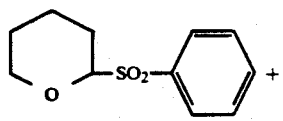

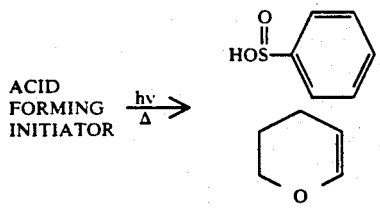

REF: LEY, ET AL., TETRAHEDRON LETTERS, 26(4), 535-538 (1985)

1c Polymers With an Acid Labile Backbone

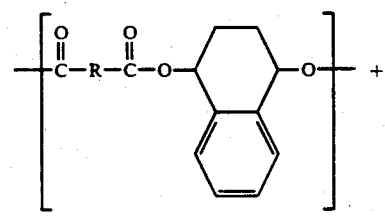

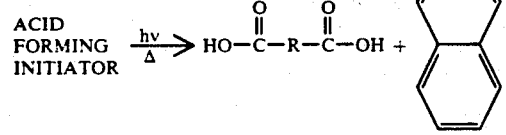

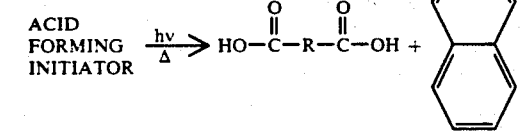

where R =
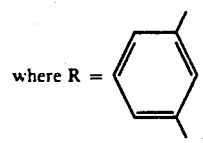

REF: FRECHET, ET AL., POLYM. MATER. SCI. AND ENG., 60 170-178, 1989

1d Polymers with Acid Labile Crosslinks

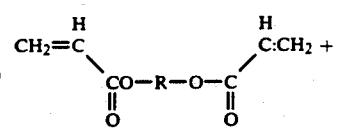

MONOFUNCTIONAL MONOMER $\xrightarrow{\text{POLYMERIZE}}$

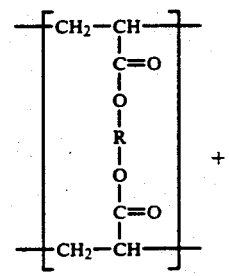

-continued

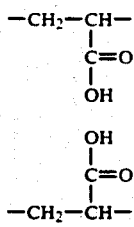

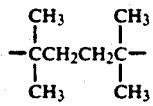 $\xrightarrow{h\nu}$ where R = di-tertiary or di-secondary alkyl, e.g.,

REF: REISER AND LI, U.S. SER. NO. 07/421,546, filed OCTOBER 13, 1989

Preferred resins (1a) involve a polymer backbone such as methacrylate, acrylate, or styrene backbone having pendant acid labile groups which are bound directly or indirectly to the polymer backbone. Preferred acid labile groups for (1a) and (1b) include:

1. alpha-alkoxy alkyl esters, represented by:

—$CO_2$—C ($R^1$) ($OR^2$)—CH($R^3$) ($R^4$)

where:
$R^1$ is hydrogen or alkyl, e.g., $C_1$ to $C_{12}$;
$R^2$ is alkyl, e.g., $C_1$ to $C_{12}$; and
$R^3$ and $R^4$ are each independently hydrogen or alkyl, e.g., $C_1$ to $C_{12}$, wherein the definition of alkyl includes the joining of $R^1$ and $R^2$, $R^1$ and either $R^3$ or $R^4$, or $R^2$ and either $R^3$ or $R^4$ to form a 5-, 6-, or 7-membered ring.

Exemplary resins containing acid labile groups represented by the above formula include poly(tetrahydropyranylmethacrylate) and copolymers of benzyl methacrylate and tetrahydropyranyl methacrylate.

2. secondary and tertiary alkyl esters, represented by:

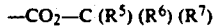

where:
$R^5$ is H, alkyl, e.g., $C_1$-$C_{12}$; alpha, beta-unsaturated alkenyl, e.g., $C_1$-$C_{12}$; aryl, e.g., $C_6$-$C_{30}$; substituted aryl, e.g., alkoxy $C_1$ to $C_6$, etc.
$R^6$ is H, alkyl, alkenyl, aryl, substituted aryl (See $R^5$)
$R^7$ is alkyl, alkenyl aryl, substituted aryl (See $R^5$)
wherein, the definition of aryl and alkyl includes the joining of $R^5$ and either $R^6$ or $R^7$ or $R^6$ with $R^7$ to form a 5, 6, or 7 membered ring.

An exemplary resin containing acid labile groups represented by the above formula would be poly (tert-butyl acrylate). An exemplary plasticizer would be di-tert-butyl malonate.

Acid forming photoinitiators or photoinitiator systems (2) useful in this embodiment of the invention include:

(2a) Onium salts such as those disclosed in Crivello, J. V., *UV Curing: Science and Technology*, (Ed. S. Peter Pappas), pp. 24–77, Technology and Marketing Corporation, (1978); Crivello, J. V., *Advances in Polymer Sci.*, 62, 1–48, 1984; Pappas, S. P., *Journal of Imaging Technology*, 11, (4), 146–157, 1985. These include aryl diazonium compounds, diaryliodonium compounds, triarylsulfonium compounds and triarylselenium compounds. These compounds may contain mixed alkyl and aryl groups wherein the aryl groups may be substituted. They are generally present in the form of salts with complex metal halide ions such as tetrafluoroborate, hexafluoroantimonate, hexafluoroarsenate, and hexafluorophosphate. Preferred initiators in this class include diaryliodonium and triarylsulfonium salts of strong acids. An especially preferred initiator is 3-(9-anthracenyl)propyl diphenylsulfonium hexafluoroantimonate.

Another useful group of photosensitive acid initiators includes oligomers and polymers comprising appended anionic groups having an aromatic onium acid photogenerator as the positive counter ion. Examples of such polymers include those described in U.S. Pat. No. 4,661,429, column 9, lines 1 to 68, and column 10, lines 1 to 14, incorporated herein by reference;

(2b) Photosensitive derivatives of sulfonic acids, such as o-nitrobenzyl esters of sulfonic acids, e.g., 2-nitrobenzyl and 2,6-dinitrobenzyl esters, as described in Houlihan, et al., *Macromolecules*, 21, 2001–2006, 1988; alpha-sulfonyloxy ketones, as described in Charlton, et al., *Can. J. Chem.*, 58, 458–462 and Demmer, et al., U.S. Pat. No. 4,618,674; and N-hydroxy imide and N-hydroxy amide sulfonates, as described in Renner, U.S. Pat. No. 4,731,605; and aryl naphthoquinonediazide-4-sulfonates, as described in Vollenbroek et al., *Polymer Material Science and Engineering*, 61, 283–289, 1989.

(2c) Halogenated compounds which generate acid upon exposure, e.g.,

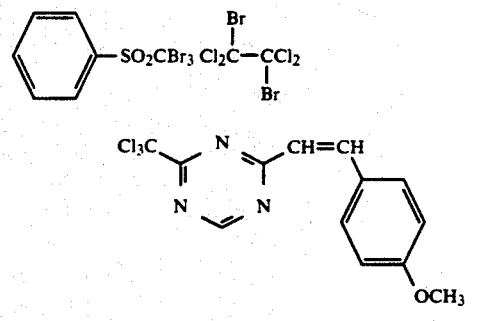

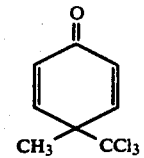

as disclosed in Holman U.S. Pat. Nos. 4,634,657; Hori et al. 3,560,216; Bonham and Petrellis 3,954,475 and 3,987,037; and Buhr 4,189,323, 4,619,998, and 4,696,888.

It may be desirable to add a sensitizer to the photoinitiator system to adjust the spectral sensitivity to the available wavelength of actinic radiation. The need will depend on the requirements of the system and the specific photosensitive compound used. For example, some iodonium and sulfonium salts only respond to wavelengths below 300 nm. These compounds may be sensitized to longer wavelengths using aromatic hydrocarbons such as perylene, pyrene, and anthracene. The decomposition of iodonium and sulfonium salts also has been sensitized by amino aryl ketones as disclosed in Sanders and Olson U.S. Pat. No. 4,755,450. Anthracene bound sulfonium salts, with chain lengths of three to four atoms are also efficient photoacid generators.

Other visible sensitizers such as arylidene aryl ketone are disclosed in Dueber U.S. Pat. No. 4,162,162, the disclosure of which is incorporated herein by reference. The sensitizers absorb radiation in the broad spectral range of 300-700 nm.

In general, the weight percents of the strong acid forming initiator and the acid labile acid forming component of the photosensitive composition need to be present in a weight percent which is sufficient to cause the photosensitive layer to become more conductive in the exposed areas. The preferred amounts depend on the acid former used, the quantum yield of catalytic acid formation and the strength of the acid, the kind of acid labile acid forming compound used, the other ingredients present, the final $T_g$ of the photosensitive composition, and the conditions under which the element is tested. Functional photosensitive elements made according to this invention contain as much as 99.6% and as little as 10% of the acid labile acid forming component. It is believed that less can be used since as little as 3% by weight of free acid as $-CO_2H$ can cause a substantial increase in the rate of charge decay of a composition. The actual percent by weight of the acid labile acid forming component needed to produce this much free acid would depend on its molecular weight. In addition, functional photosensitive elements made according to this invention have contained as little as 0.2% by weight of catalytic acid-forming photoinitiator and as much as 5 to 7% by weight of photoinitiator. The higher level of photoinitiator is possible with neutral acid formers and may be desirable with photoinitiators which have low absorption in the actinic region or low quantum yield of catalytic acid formation. However, other factors can limit the amount of photoinitiator that can be used, especially if they are salts, e.g., triarylsulfonium hexafluoroantimonate salts. Experiments have indicated that the ability to formulate a photosensitive element in which the unexposed area can hold charge at working humidities of 20% relative humidity or greater is difficult when the photoinitiator salt exceeds 3% by weight.

A wide range of plasticizers which are non-acid labile are effective in achieving reasonable exposure time. When a macromolecular binder is present in the layer, a plasticizer would be selected which shows reasonable compatibility with the binder and other components of the composition. With acrylic binders, for example, plasticizers can include: dibutyl phthalate and other esters of aromatic acids; esters of aliphatic polyacids such as diisooctyl adipate, and nitrate esters; aromatic or aliphatic acid esters of glycols, polyoxyalkylene glycols, aliphatic polyols; alkyl and aryl phosphates; chlorinated paraffins; and sulfonamide types can be used.

In general, water insoluble plasticizers are preferred for greater high humidity storage stability and environmental operating latitude, but are not required. Suitable plasticizers include: triethylene glycol, triethylene glycol diacetate, triethylene glycol dipropionate, triethylene glycol dicaprylate, triethylene glycol dimethyl ether, triethylene glycol bis(2-ethylhexanoate), tetraethylene glycol diheptanoate, poly(ethylene glycol), poly(ethylene glycol) methyl ether, isopropyl naphthalene, diisopropyl naphthalene, poly(propylene glycol), glyceryl tributyrate, diethyl adipate, diethyl sebacate, dibutyl suberate, tributyl phosphate, tris(2-ethylhexyl) phosphate, t-butylphenyl diphenyl phosphate, triacetin, dioctyl phthalate, Brij® 30 [$C_{12}H_{25}(OCH_2CH_2)_4OH$], and Brij® 35 [$C_{12}H_{25}(OCH_2CH_2)_{20}OH$], tris(2-butoxyethyl) phosphate and phthalates such as dicyclohexyl phthalate, dioctyl phthalate, diphenyl phthalate, diundecyl phthalate, butyl benzyl phthalate, 2-ethylhexyl benzyl phthalate, benzoates, e.g., glyceryl tribenzoate. Particularly preferred plasticizers for use in simple cellulose acetate butyrate systems are triethylene glycol dicaprylate, tetraethylene glycol diheptanoate, diethyl adipate, Brij® 30 and tris(2-ethylhexyl) phosphate. Other plasticizers that yield equivalent results will be apparent to those skilled in the art, and may be employed in accordance with the invention. Preferred plasticizers are those which are moisture insensitive and those which are not extracted by Isopar®-L aliphatic hydrocarbon.

Plasticizers, when present, are used for adjusting the $T_g$ and film forming properties of the photosensitive layer. The amounts vary widely depending on their $T_g$'s and the overall photosensitive composition.

The combination of organic polymeric binder and plasticizer is important for achieving a minimum contrast potential, i.e., the difference in voltage between the exposed and unexposed areas. Binders with different resistivities and plasticizers with different $T_g$'s are selected so some degree of radical and/or ion mobility within the film matrix is achievable. A film matrix that is glassy would not work because the active species generated during exposure could not diffuse through the matrix to react with each other. Likewise a film matrix that has a very low viscosity would not be able to retain a sufficiently high charge in the unexposed areas to attract enough toner or developer to achieve the proper toner or developer density.

Suitable binders include: acrylate and methacrylate polymers and co- or terpolymers, e.g., poly(methyl methacrylate), poly(ethyl methacrylate), poly(isobutyl methacrylate), etc.; vinyl polymers and copolymers, e.g., poly(styrene(70)/methyl methacrylate(30), acrylonitrile/butadiene/styrene, polystyrene, etc.; polyvinyl acetals, e.g., poly(vinyl acetal), poly(vinyl formal), etc.; polyesters, e.g., poly(tetramethylene terephthalate), etc.; condensation polymers, e.g., polycarbonate, polysulfone, polyetherimide, polyphenylene oxide, poly(1,4-cyclohexanedimethanol terephthalate), etc.; butadiene copolymers, e.g., styrene butadiene copolymers, etc.; cellulose esters and ethers, e.g., ethyl cellulose, etc.; and polyurethanes. For formulations having improved environmental latitude, the selection of a polymeric binder may depend on its $T_g$. The $T_g$ of a polymer is affected by the chemical structures of the main chain and the side groups. Polymers with rigid structures generally show high $T_g$'s while more flexible polymers exhibit low $T_g$'s. Polymers of desired $T_g$'s may be obtained by copolymerization of proper combinations of rigid and flexible monomers. The following publication which summarizes glass transition temperatures of homopolymers known in the literature, "POLYMER HANDBOOK", ed. J. Brandrup & E. H. Immergut, John Wiley & Sons, Inc., 1975, is incorporated herein by reference. Section III-140-192 of said publication lists $T_g$'s of most known polymers.

Preferred binders include the Elvacite® resins because their $T_g$'s range from 15° C. to 105° C. Low $T_g$ resins including poly(ethyl methacrylate) ($T_g$ 70° C.), Elvacite® 2045 or 2042, in combination with high $T_g$ resins poly(methyl methacrylate) ($T_g$ 110° C.) or poly(styrene/methyl methacrylate) ($T_g$ 95° C.) are particularly preferred. Broadening the $T_g$'s with combinations of high and low $T_g$ binders provides improved environmental stability. The mixed binders should have a resistivity in the range of $10^{14}$ to $10^{20}$ ohm·cm, preferably $10^{14}$ to $10^{16}$ ohm·cm.

Colorants which include dyes and pigments, may be useful in this invention. The amounts of colorant and plasticizer should be such that the unexposed photosensitive compositions have sufficiently high resistivity to hold charges.

Acid-forming photoinitiator systems in which photoformed radicals reduce acid formers such as diphenyliodonium salts are known. Consequently, the photosensitive layer may also contain ingredients used in conventional radical initiated systems, e.g., coinitiators, for example, hexaarylbiimidazoles, thermal stabilizers, brighteners, UV absorbers, and antihalation agents.

Electron donors and electron acceptors may be used for modifying decay characteristics. Some useful electron donors and electron acceptors for modifying decay characteristics include: aromatic amines, e.g., triphenyl amine, methyl diphenyl amine, N-dimethyl aniline, aromatic phosphines, e.g., triphenyl phosphine, aromatic arsines, e.g., triphenyl antimony, carbazole compounds, e.g., 9-ethyl, polyvinyl, aromatic compounds, e.g., naphthalene, benzophenone, trinitrofluorenone (acceptor), p-biphenyl (acceptor). Triphenylamine is the preferred electron donor, biphenyl is the preferred electron acceptor.

Useful thermal stabilizers include: 1-phenyl-3-pyrazolidone, hydroquinone, 1,4,4-trimethyldiazobicyclo(3,2,2)-non-2-ene-2,3-dioxide, p-methoxyphenol, alkyl and aryl-substituted hydroquinones and quinones, tert-butyl catechol, pyrogallol, copper resinate, beta-naphthol, cuprous chloride, 2,6-di-tert-butyl p-cresol, phenothiazine, nitrobenzene, dinitrobenzene, p-toluquinone and chloranil. The dinitroso dimers described in Pazos U.S. Pat. No. 4,168,982, incorporated herein by reference, are also useful. Normally a thermal polymerization inhibitor will be present to increase stability in the storage of the photosensitive composition.

The photosensitive layer is prepared by mixing the ingredients of the photosensitive system in a solvent such as methylene chloride, etc., coating onto a substrate, and evaporating the solvent. Dry coating weight should be about 40 to 150 mg/sq. dm.

The conductive support may be a metal plate, such as aluminum, copper, zinc, silver or the like, a conductive polymeric film, a support such as paper, glass, synthetic resin and the like which has been coated on one or both sides with a metal, metal oxide, or metal halide by vapor deposition or chemical deposition, a support which has been coated with a conductive polymer, or a support which has been coated with a polymeric binder containing a metal, metal oxide, metal halide, conductive polymer, carbon, or other conductive fillers.

Any convenient source of ultraviolet/visible light may be used as actinic radiation to activate the lightsensitive composition and induce the formation of an image. In general, light sources that supply radiation in the region between about 2000 Å and about 8000 Å are useful in producing images with the acid labile compound containing compositions of this invention. Among the light sources which have been employed are sun lamps, electronic flash guns, germicidal lamps, carbon arcs, mercury-vapor arcs, fluorescent lamps with ultraviolet emitting phosphors, argon and xenon glow lamps, electronic flash units, photographic flood lamps, ultraviolet lamps providing specifically light of short wave length (2537 Å) and lamps providing light of long wave length (4500 Å). There may also be used coherent light beams, for example, pulsed nitrogen lasers, argon ion lasers and ionized Neon II lasers, whose emissions fall within or overlap the UV/visible absorption bands. Visible light emitting lasers such as argon ion may be used for visibly sensitized photosensitive layers.

Ultraviolet emitting cathode ray tubes widely useful in printout systems for writing on photosensitive materials are also useful for imaging the subject compositions. These in general involve a UV-emitting phosphor internal coating as the means for converting electrical energy to light energy and a fiber optic face plate as the means for directing the radiation to the photosensitive target. For purposes of this invention, the phosphors should emit strongly below 420 nm (4200 Å) so as to substantially overlap the near UV-absorption characteristic of the photosensitive compositions. Representative phosphors include the P4B (emitting at 300-550 nm, peaking at 410 nm), P16 (330-460, peaking at 380 nm) and P22B (390-510, peaking at 450 nm) types. Other phosphors which may be used are the P11 (400-560 nm, peaking at 460 nm) and $ZrP_2O_7$ types. (The Electronic Industries Association, New York, N.Y. assigns P-numbers and provides characterizing information on the phosphors; phosphors with the same P-number have substantially identical characteristics.)

Images may be formed by a beam of light or by exposure to light of a selected area behind a positive separation, a stencil, or other relatively opaque pattern. The positive separation may be a silver positive on cellulose acetate or polyester film base. The positive separation may also be one in which the opacity results from aggregations of areas of different refractive index. Image formation may also be accomplished in a conventional diazo printing apparatus, or in a thermography device, provided the instrument emits some of its light in the ultraviolet range. A piece of onionskin or light-to-medium-weight bond paper which bears typewriting, for example, will serve as a master pattern from which copies can be made.

The subject compositions may also be activated for the purposes of this invention by electron beams. The optimum conditions depend on the formulation and its thickness, the electron beam energy and the exposure time, and are readily determined by trial. Beams having average electron energies as low as about 10 kilovolts and as high as about 2 million electron volts have been used successfully.

Where artificial radiation sources are used, the distance between the photosensitive layer and the radiation source may be varied according to the radiation sensitivity of the composition and the nature of the photosensitive composition. Customarily, mercury vapor arcs are used at a distance of 1.5 to 60 inches (3.8 to 152.4 cm) from the photosensitive layer.

The length of time for which the compositions are exposed to radiation may vary upward from fractions of a second to several minutes. The exposure times will vary, in part, according to the nature of the light sensitive composition, e.g., concentration of the acid labile compound, initiator, plasticizer and the type and intensity of the radiation, its distance from the photosensitive layer.

Positive images are achieved by a single exposure. Mild heating of the element after exposure to increase the rate of the chemical amplification step may be useful for increasing the image contrast and photospeed. The exposed master can then be charged and toned for use in color proofing applications, etc.

The preferred charging means is corona discharge. Other charging methods, e.g., discharge of a capacitor, can also be used. Any electrostatic toner or liquid developer and any method of toner or developer application can be used. Preferred liquid developers, i.e., a suspension of pigmented resin toner particles in a nonpolar liquid and charged with ionic or zwitterionic compounds. The nonpolar liquids normally used are the Isopar ® branched chain aliphatic hydrocarbons (sold by Exxon Corporation) which have a Kauri-butanol value of less than 30 and optionally containing various adjuvants are described in Mitchell U.S. Pat. Nos. 4,631,244 and 4,663,264, Taggi 4,670,370, Larson 4,760,809, Mitchell 4,734,352, Larson 4,702,985, Trout 4,707,429, El-Sayed and Taggi 4,702,984, and Larson and Trout 4,681,831. The nonpolar liquids are narrow high purity cuts of isoparaffinic hydrocarbon fractions with the following boiling ranges: Isopar ®-G, 157°–176° C., Isopar ®-H 176°–191° C., Isopar ®-K 177°–197° C., Isopar ®-L 188°–206° C., Isopar ®-M 207°–254° C., Isopar ®-V 254°–329° C. Preferred resins having an average particle size of less than 10 $\mu$m are copolymers of ethylene (80 to 99.9%)/acrylic or methacrylic acid (20 to 0%)/alkyl of acrylic or methacrylic acid where alkyl is 1 to 5 carbon atoms (0 to 20%), e.g., copolymers of ethylene (89%) and methacrylic acid (11%) having a melt index at 190° C. of 100. A preferred nonpolar liquid soluble ionic or zwitterionic component is Basic Barium Petronate ® oil-soluble petroleum sulfonate manufactured by Witco Corp., NY, N.Y. Dry particulate toners are also useful.

After developing, the developed image is transferred to another surface, such as paper for the preparation of a proof. Other receptor surfaces are polymeric film, or cloth. For making integrated circuit boards, the transfer surface can be an insulating board on which conductive circuit lines can be printed by this process, or it can be an insulating board covered with a conductor (e.g., a fiber glass board covered with a copper layer) on which a resist is printed by this process. Transfer is accomplished by electrostatic or other means, e.g., by contact with an adhesive receptor surface. Electrostatic transfer can be accomplished in any known manner, e.g., by placing the transfer surface in contact with the toned image, applying a squeegee to assure maximum contact, and applying corona discharge to the backside of the transfer element.

INDUSTRIAL APPLICABILITY

The photosensitive electrostatic master is particularly useful in the graphic arts field, such as in the area of color proofing wherein the proofs prepared duplicate the images achieved by printing. Other uses for the photosensitive master include preparation of printed circuit boards, resists, solder masks, etc.

EXAMPLES

The following examples illustrate but do not limit the invention wherein the percentages and parts are by weight. Weight average molecular weights ($M_w$) can be determined by gel permeation chromatography (GPC). The number average molecular weight ($M_n$) can be determined by known osmometry techniques. $T_g$ is glass transition temperature.

| | ACID LABILE POLYMERS CAPABLE OF FORMING ACID | | | | | |
|---|---|---|---|---|---|---|
| # | POLYMER COMPOSITION | MOLAR % | PREP | $M_w$ | $M_n$ | $T_g$ |
| A | Tetrahydropyranyl methacrylate/ benzyl methacrylate | 50:50 | GTP | 22600 | 20100 | — |
| B | Tetrahydropyranyl methacrylate/ butyl methacrylate | 22:78 | GTP | 20800 | 19600 | 49 |
| C | Tetrahydropyranyl methacrylate/ benzyl methacrylate | 56:44 | GTP | 16500 | 12700 | — |
| D | Tetrahydropyranyl methacrylate/ benzyl methacrylate/ methacrylic acid | 46:51:3 | RADICAL | 183000 | 58500 | — |
| E | Tetrahydropyranyl methacrylate/ 2-ethylhexyl methacrylate/ benzyl methacrylate | 33:40:27[1] | GTP | 25800 | 13800 | 58 |
| F | Tetrahydropyranyl methacrylate/ 2-ethylhexylmethacrylate/ benzyl methacrylate | 39:32:29[1] | GTP | 27000 | 14900 | 68 |
| G | Tetrahydropyranyl methacrylate/ 2-ethylhexylmethacrylate/ cyclohexyl methacrylate | 39:47:14[1] | GTP | 31100 | 26200 | 37 |
| H | Poly(tetrahydro pyranyl methacrylate) | 100 | GTP | 20000 | 13600 | 91 |

[1] expressed in weight percent

| INITIATORS |
|---|
| IN1 |
| CYRACURE ® UVI 6974 |
| Mixed Triarylsulfonium Hexafluoroantimonate Salts |
| REF: MANUFACTURED BY UNION CARBIDE |
| IN2 |

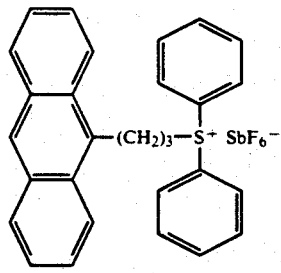

REF: TILLEY, M. PHD. DISSERTATION, NORTH DAKOTA STATE UNIVERSITY, OCTOBER, 1988, pg. 73.

IN3

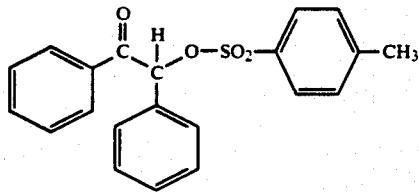

BENZOIN ESTER OF TOLUENE SULFONIC ACID
REF: DEMMER, et al., U.S. Pat. No. 4,618,564

IN4

Dibromotetrachloroethane (Aldrich Chemical Co.)

Acid Labile Acid Forming Plasticizers

| | |
|---|---|
| Bis THP-Phthalate | Bis(tetrahydropyranyl)phthalate |
| DTBM | Di-tert-butyl malonate |
| DTBO | Di-tert-butyl oxalate |

Binders

| | |
|---|---|
| PMMA | Poly(methyl methacrylate) I.V. 1.3 |

Plasticizers

| | |
|---|---|
| BP | Benzophenone |
| GTB | Glycerol tribenzoate |

The acid labile polymers capable of forming acid are prepared according to the following procedures:

Preparation A

Poly(tetrahydropyranyl methacrylate
[50 mol %] benzyl methacrylate [50 mol %])

Tetrahydropyranyl methacrylate (THPMA) and benzyl methacrylate were separately purified by passage over a column of basic alumina under an argon atmosphere. To a stirred solution of 1.79 mL (5.6 mmol) of 1-(2-trimethylsiloxyethoxy)-1-trimethylsiloxy-2-methyl-1-propene and 0.121 mL of tetrabutylammonium biacetate (0.04M in tetrahydrofuran) in 180 mL of tetrahydrofuran (THF) was added a mixture of 61.4 g (60.3 mL, 0.35 mol) of benzyl methacrylate and 59.5 g (58.3 mL, 0.35 mol) of tetrahydropyranyl methacrylate at a rate such that the temperature remained near 36° C. When the temperature had returned to room temperature, NMR analysis of an aliquot of the reaction mixture showed that no residual monomer was present. The product was precipitated in methanol and dried at 0.1 mm (25° C.) to give 120 g of poly(THPMA, benzyl methacrylate). NMR analysis showed the copolymer to consist of 50 mole % THPMA units and 50 mole % benzyl methacrylate units. Gel permeation chromatography (GPC): $M_n = 20,100$, $M_w = 22,600$, $M_w/M_n = 1.12$. Differential scanning calorimetry (DSC): $T_g = 96.8°$ C. with a decomposition endotherm at 184.7° C.

Preparation B

Poly(tetrahydropyranyl methacrylate
[22 mol %] n-butyl methacrylate [78 mol %])

THPMA and n-butyl methacrylate were purified separately by passage over a column of basic alumina under argon. To a solution of 1.48 mL (5 mmol) of 1-(2-trimethylsiloxyethoxy)-1-trimethylsiloxy-2-methyl-1-propene and 0.1 mL of tetrabutylammonium biacetate (0.04M in THF) in 150 mL of THF under an argon atmosphere was added a mixture of 64.1 g (71.7 mL, 0.45 mol) of n-butyl methacrylate and 21.6 g (21.2 mL, 0.127 mol) of THPMA at a rate such that the temperature of the reaction remained between 35° and 40° C. NMR analysis of the reaction mixture showed no residual monomer. Precipitation in methanol gave an oil, which, after drying at 0.1 mm, solidified to 60 g of poly(n-butyl methacrylate [78 mol %], THPMA [22 mol %]). GPC: $M_n = 19,600$, $M_w = 20,800$, $M_w/M_n = 1.11$. DSC: $T_g = 49.2°$ C.

Preparation C

Poly(tetrahydropyranyl methacrylate
[56 mol %] benzyl methacrylate [44 mol %])

Using a procedure essentially similar to that of Preparation A, a mixture of 23.5 g of THPMA and 26.8 g of benzyl methacrylate gave 48 g of poly(THPMA [56 mol %], benzyl methacrylate [44 mol %]). GPC: $M_n = 12,700$, $M_w = 16,500$, $M_w/M_n = 1.30$.

Preparation D

High Molecular Weight Poly(tetrahydropyranyl
methacrylate [46 mol %] benzyl methacrylate [51 mol
%] methacrylic acid [3 mol %])

A solution of 24.4 mL (0.141 mol) of benzyl methacrylate, 23.4 mL (0.141 mol) of THPMA, and 75 mg of azobis(isobutyronitrile) (VAZO 64) was heated at 70° C. under argon for 7 hours, during which time the solution became viscous. An additional 75 mg of VAZO ® 64 (dissolved in 5 mL of ethyl acetate) was added, and heating at 75° C. was continued for 5 hr. NMR analysis of the solution showed about 8.5% residual monomer(s). The product was isolated by precipitation in methanol. Titration of an aliquot of the product with standard sodium hydroxide solution showed 0.18 meq/g of methacrylic acid units in the polymer. Thus, the product is poly(THPMA [46 mol %], benzyl methacrylate [51 mol %], methacrylic acid [3 mol %]). GPC: $M_n = 58,500$, $M_w = 183,000$, $M_w/M_n = 3.13$.

Preparation E

Poly(tetrahydropyranyl methacrylate [33 wt %]
2-ethylhexyl methacrylate [40 wt %] benzyl
methacrylate [27 wt %])

THPMA, 2-ethylhexyl methacrylate, and benzyl methacrylate were purified by passage over a column of basic alumina under argon. To a solution of 0.44 mL (1.5 mmol) of 1-(2-trimethylsiloxyethoxy)-1-trimethylsiloxy-2-methyl-1-propene and 0.08 mL of tetrabutylammonium biacetate (0.04M in THF) in 100 mL of THF was added a mixture of 9.9 g (9.7 mL, 58.2 mmol) THPMA, 12 g (13.6 mL, 60.6 mmol) of 2-ethylhexyl methacrylate, and 8.1 g (8.2 mL, 46 mmol) of benzyl methacrylate at a rate such that the temperature remained below 30° C. When the monomer mixture had been added, addition of 0.03 mL of tetrabutylammonium biacetate (0.04M in THF) resulted in a temperature rise of 7° C. NMR analysis of the reaction mixture showed the presence of a trace of unreacted monomers. Successive precipitation in methanol and in hexane cooled at −78° C. followed by drying gave 23.1 g of solid poly(THPMA [33 wt %], 2-ethylhexyl methacrylate [40 wt %], benzyl methacrylate [27 wt %]). GPC: $M_n=13,800$, $M_w=25,800$ $M_w/M_n=1.87$. DSC: $T_g=57.6°$ C. with a decomposition endotherm peaking at 188.9° C.

Preparation F

Poly(tetrahydropyranyl methacrylate [39 wt %] 2-ethylhexyl methacrylate [32 wt %] benzyl methacrylate [29 wt %])

THPMA (11.7 g), 9.6 g of 2-ethylhexyl methacrylate, and 8.7 g of benzyl methacrylate were polymerized using the general procedure of Preparation E (with precipitation in cold methanol) to give 25.5 g of poly(THPMA [39 wt %], 2-ethylhexyl methacrylate [32 wt %], benzyl methacrylate [29 wt %]). GPC: $M_n=14,900$, $M_w=27,000$, $M_w/M_n=1.81$. DSC: $T_g=67.7°$ C. with a decomposition endotherm peaking at 194.1° C.

Preparation G

Poly(tetrahydropyranyl methacrylate [39 wt %] 2-ethylhexyl methacrylate [47 wt %] cyclohexyl methacrylate [14 wt %])

Using essentially the same procedure as in Preparation E, 11.7 g of THPMA, 14.1 g of 2-ethylhexyl methacrylate, and 4.2 g of cyclohexyl methacrylate was converted to 28 g of poly(THPMA [39 wt %], 2-ethylhexyl methacrylate [47 wt %], cyclohexyl methacrylate [14 wt %]). GPC: $M_n=26,200$, $M_w=31,100$, $M_w/M_n=1.19$. DSC: $T_g=37.3°$ C. with a decomposition endotherm peakinq at 184.4° C.

Preparation H

Poly(tetrahydropyranyl methacrylate)

To a stirred solution of 0.15 mL (0.47 mmol) of 1-(2-trimethylsiloxyethoxy)-1-methoxy-2-methyl-1-propene and 0.03 mL of tetrabutylammonium biacetate (0.04M in THF) in 30 mL of THF was added dropwise 10 g (9.8 mL, 59 mmol) of tetrahydropyranyl methacrylate (purified by passage over basic alumina under an argon atmosphere) at a rate such that the temperature of the reaction mixture remained between 35° and 40° C. NMR analysis of an aliquot of the reaction mixture showed that there was no residual monomer. Precipitation in methanol gave 8.3 g of poly(tetrahydropyranyl methacrylate). GPC: $M_n=13,600$, $M_w=20,000$, $M_w/M_n=1.47$. DSC: $T_g=91°$ C.

An acid labile acid forming plasticizer is prepared according to the following procedure:

Preparation of bis(tetrahydropyranyl)phthalate

A mixture of 16.6 g (0.1 mol) of phthalic acid, 160 mL of 2,3-dihydro-2H-pyran, and 0.5 g of crosslinked poly(4-vinylpyridine hydrochloride) was stirred at reflux for 18 hr. The polymeric catalyst was removed by filtration. After removal of the excess dihydropyran under reduced pressure there was obtained 34 g of bis(tetrahydropyranyl) phthalate as an oil. DSC shows a decomposition endotherm at 197.5° C. NMR analysis of the product confirms the assigned structure, and shows the presence of a small amount of dihydropyran.

EXAMPLE 1

A photosensitive element was prepared having a 0.004 inch (0.01016 cm) aluminized polyethylene terephthalate support and a photosensitive layer with a coating weight of 108 mg/dm². The photosensitive layer was coated from the following composition:

| INGREDIENT | WEIGHT (g) |
| --- | --- |
| Methylene chloride | 24.5 |
| Copolymer of benzyl methacrylate and tetrahydropyranyl methacrylate (Polymer C) | 8.0 |
| Benzophenone | 1.45 |
| Initiator, IN2 | 0.019 |

The photosensitive element was prepared by dissolving the above ingredients in the methylene chloride and coating the solution onto the support with a doctor blade and evaporating the solvent by air drying overnight. Strips of the coating were cut to evaluate the ability of the unexposed coating to hold charge and the exposed coating to conduct charge to the underlying aluminum layer. One strip was given an exposure of 100 mj/cm² on a Riston ® PC-130 vacuum frame printer (E. I. du Pont de Nemours and Co., Wilmington, Del.) having a 5 KW Sylvania M061 lamp. The output from the lamp was calibrated with a IL 700A Research Radiometer with an XR140B detector. The elements were charged with a Monroe Electronics (Lyndonville, N.Y.), Model 151A Coronaply High Voltage Supply using a moving grid charged at 5.7 KV. The voltage of the surface charge retained was measured with a Monroe Electronics Isoprobe Electrostatic Voltmeter Model 244 as a function of time after charging. The relative humidity was held at 36% and the room temperature at 70° F. (21.1° C.). Under these conditions the unexposed photosensitive element held an initial charge of 202 volts; the charge decayed to only 177 volts in 15 seconds. The exposed element held an initial charge of only one volt which decayed to zero in less than 5 seconds. This demonstrates that the element is substantially less conductive prior to exposure to UV radiation and becomes much more conductive after exposure. The change in conductivity of the element can be used to form images.

The quality of the image formed on the element was evaluated by exposing several strips of the element, each with a different amount of energy, through an UGRA plate control target placed emulsion side down directly onto the photosensitive layer of the element. The target, which includes a range of dot patterns from 0.5% highlight dots to 99.5% shadow dots at a density of 150 lines/inch screen, is available from the Graphic Arts Technical Foundation, Pittsburgh, Pa. The exposures were carried out in the PC-130 Printer. Care was taken to insure that the control wedge made good contact with the photosensitive element when the vacuum was drawn in the exposure frame. The control wedge did not stick to the photosensitive layer, even though the latter had no cover sheet.

After exposure the samples were charged with the Cronaply High Voltage Supply with the charging grid set adjusted to 8.2 KV. They were then dipped into a magenta electrostatic toner dispersion and air dried. Upon examination of the toner images that remained, it was found that the 20 mj exposure had slight staining in the exposed areas. The 40 mj exposure sample had no stain and held 1% toned highlight dots and open 98% shadow dots.

This photosensitive element prepared was also tested for image toning and transfer as described below. It was first exposed through a UGRA plate control target for 50-80 millijoules per square centimeter using a Douthitt Option X Exposure Unit (Douthitt Corp., Detroit, Mich.), equipped with a Model TU 64 Violux ® 5002 lamp assembly (Exposure Systems Corp., Bridgeport, Conn.) and model No. 5027 photopolymer lamp. The exposed master was then mounted on a drum surface, which rotates at 2.2 inches (5.59 cm) per second with leading edge clamps which were used to ground the photosensitive master aluminized backplane to the drum, then charged electrostatically as described below, the resulting latent image was developed with a liquid electrostatic developer described below of opposite polarity, and the toned image was transferred from the element to paper. The charging of the element was accomplished with a scorotron placed about 2 o'clock position on the drum and spaced 0.5 mm from the element and operated at 100-300 V, and a wire operated 550 microAmp. The element was toned 3.5 seconds after charging using a liquid electrostatic developer similar to that described in Example 4 and the developer had a conductivity of 12 picomho/cm. The toner image was transferred to 60# Textweb paper, Seneca Paper Co., Rochester, N.Y. using a combination of a conductive rubber tackdown roller, operated at −1.0 to 5 KV and a transfer scorotron, operated at 20-60 microAmp. The paper was placed between the toned element and the conductive rubber tackdown roller so that the paper was in contact with the toner image. The paper was then passed under the scorotron causing the toner image on the element to be transferred to the paper. The image was then fixed to the paper by fusing at 175° C. for 15 seconds. A dot tonal range of 3-99% was observed using the magenta toner and 2-98% using the black toner, both showed clean background.

EXAMPLE 2

A photosensitive element was prepared as described in Example 1 with the following exceptions: a polymer of slightly different composition and higher molecular weight (polymer D) was used in the same weight amount. The photosensitive coating made with this polymer was less likely to form microcracks on handling. When an unexposed sample of this element was charged at 5.7 KV it acquired an initial charge of 162 volts; this decayed to 124 volts in 15 seconds. A sample exposed to 100 mj/cm$^2$ of UV radiation charged in the same fashion held only 7 volts, which fell to 0 within 5 seconds. Samples were imaged through the UGRA target at 10, 20, and 40 mj/cm$^2$. The 10 mj exposure had toner staining in the exposed areas. The 20 mj exposure held 0.5% highlight dots and 98% shadow dots open. The 40 mj exposure held 1% highlight dots and 99% shadow dots open.

Exposed masters prepared from the photosensitive element described in this example were evaluated for toning and image transfer as described in Example 1 using the magenta and the black liquid electrostatic developers described in Example 4. Exposures were 80 to 120 millijoules per square centimeter. A tonal range of 3-97% was observed using the magenta toner and 3-98% using the black toner, both showed clean background.

EXAMPLE 3

Seven different acid labile polymers with acid labile ester monomers which ranged from 25% to 56% by weight of the polymer and glass transition temperatures which ranged from 37° C. to 74° C. were used, at concentrations which ranged from 69% to 99.6% by weight of the composition. Plasticizer concentrations ranged from 0% to 30% and initiator concentrations ranged from 0.2% to 7.1%. These compositions demonstrate more rapid charge decay in the exposed state than in the unexposed state and in selected cases, imaged samples, when charged and toned, gave tonar images on the plate which held both shadow and highlight dots.

The photosensitive elements were prepared and coated as described in Example 1 with the following exceptions: ingredients and amounts listed in Table 1 below were used. They were tested for charge decay in the unexposed and exposed states. The dot range of selected elements which were given an imagewise exposure through the UGRA target are also shown in Table 1.

TABLE 1

| FORMULATIONS AND CHARGE DECAY FOR EXAMPLE 3 | | | | | | | | |
|---|---|---|---|---|---|---|---|---|
| COMPOSITION | | | | | | | | |
| NO. | POLYM. | % | INIT (IN) | % | COINIT | % | PLAST | % |
| 1 | A | 96.0 | 1 | 3.0 | CTX[1] | 1.0 | — | — |
| 2 | A | 68.4 | 1 | 0.4 | CTX | 0.8 | BP | 30.4 |
| 3 | C | 69.0 | 1 | 0.2 | CTX | 0.4 | BP | 30.2 |
| 4 | C | 84.0 | 1 | 0.2 | CTX | 0.4 | BP | 15.2 |
| 5 | C | 83.6 | 1 | 1.0 | CTX | 0.4 | BP | 15.0 |
| 6 | C | 87.6 | 1 | 1.0 | CTX | 0.4 | BP | 11.4 |
| 7 | C | 84.4 | 2 | 0.2 | — | — | BP | 15.4 |
| 8 | D | 69.0 | 1 | 0.2 | CTX | 0.4 | BP | 30.2 |
| 9 | D | 84.0 | 1 | 0.2 | CTX | 0.4 | BP | 15.4 |
| 10 | D | 84.4 | 2 | 0.2 | — | — | BP | 15.4 |
| 11 | D | 99.4 | 1 | 0.2 | CTX | 0.4 | — | — |
| 12 | D | 98.5 | 1 | 1.0 | CTX | 0.4 | — | — |
| 13 | B | 99.6 | 2 | 0.4 | — | — | — | — |
| 14 | E | 99.6 | 2 | 0.4 | — | — | — | — |
| 15 | F | 99.6 | 2 | 0.4 | — | — | — | — |
| 16 | G | 99.6 | 2 | 0.4 | — | — | — | — |
| 17 | A | 63.8 | 3 | 7.1 | CTX | 0.7 | BP | 28.4 |
| 18 | C | 83.5 | 3 | 5.0 | — | — | BP | 11.5 |

| | | | | | | | IMAGEWISE EXPOSURE | |
|---|---|---|---|---|---|---|---|---|
| EXP | | | CHARGE DECAY | | | | EXP | HIGH-LIGHT | SHADOW |
| # Mj | % RH | T °F. | $V_0$ | $V_5$ | $V_{10}$ | $V_{15}$ | $V_{60}$ | mj/cm$^2$ | DOTS % | DOTS % |

TABLE 1-continued

FORMULATIONS AND CHARGE DECAY FOR EXAMPLE 3
COMPOSITION

| | | | | | | | | | | | |
|---|---|---|---|---|---|---|---|---|---|---|---|
| 1 | NONE | 20 | 73 | 118 | 117 | 115 | 115 | 112 | | | |
| 2 | NONE | 28 | 71 | 48 | 46 | 46 | 45 | 44 | | | |
| 3 | NONE | 50 | 70 | 0 | | | | | | | |
| 4 | NONE | 50 | 70 | 544 | 484 | 442 | 417 | 292 | | | |
|   | 100  | 50 | 70 | 268 | 260 | 255 | 252 | 218 | | | |
| 5 | NONE | 50 | 70 | 194 | 124 | 92 | 73 | | | | |
|   | 100  | 50 | 70 | 3 | 0 | | | | | | |
| 6 | NONE | 50 | 70 | 239 | 230 | 225 | 220 | | 50 | 2 | 97 |
|   | 100  | 50 | 70 | 4 | 1 | 0 | | | | | |
| 7 | NONE | 50 | 70 | 228 | 218 | 212 | 208 | | 10 | 3 | 98 |
|   | 100  | 50 | 70 | 5 | 0 | | | | | | |
| 8 | NONE | 50 | 70 | 0 | | | | | | | |
| 9 | NONE | 50 | 70 | 400 | 353 | 315 | 287 | 175 | | | |
|   | 100  | 50 | 70 | 346 | 302 | 272 | 251 | 158 | | | |
| 10 | NONE | 42 | 71 | 375 | 358 | 348 | 339 | | 10 | 1 | 97 |
|    | 100  | 42 | 71 | 18 | 1 | 0 | | | | | |
| 11 | NONE | 50 | 70 | 612 | 601 | 597 | 594 | 582 | | | |
|    | 100  | 50 | 70 | 600 | 587 | 578 | 573 | 550 | | | |
| 12 | NONE | 50 | 70 | 270 | 261 | 256 | 253 | | | | |
|    | 100  | 50 | 70 | 20 | 4 | 1 | 0 | | | | |
| 13 | NONE | 50 | 72 | 168 | 161 | 155 | 150 | 143 | | | |
|    | 100  | 50 | 72 | 107 | 42 | 18 | 10 | 3 | | | |
| 14 | NONE | 50 | 72 | 777 | 757 | 755 | 744 | 733 | 100 | 2 | 95 |
|    | 100  | 50 | 72 | 125 | 46 | 25 | 16 | 9 | | | |
| 15 | NONE | 50 | 72 | 619 | 611 | 603 | 600 | 592 | | | |
|    | 100  | 50 | 72 | 129 | 53 | 30 | 19 | 10 | | | |
| 16 | NONE | 50 | 72 | 580 | 548 | 540 | 534 | 520 | 50 | 3 | 95 |
|    | 100  | 50 | 72 | 123 | 41 | 19 | 13 | 7 | | | |
| 17 | NONE | 28 | 71 | 57 | 54 | 53 | 52 | 49 | 5 | 2 | 97 |
| 18 | NONE | 42 | 71 | 266 | 247 | 240 | 234 | | | | |
|    | 100  | 42 | 71 | 215 | 180 | 150 | 126 | | | | |

[1]CTX is chlorotnhioxanthone

EXAMPLE 4

A four color proof is obtained by following the steps described below. First, complementary registration marks are cut into the photosensitive layers of the electrostatic masters prior to exposure. Masters for each of the four color separations are prepared by exposing four photosensitive elements to one of the four color separation negatives corresponding to cyan, yellow, magenta and black colors. Each of the four photosensitive layers is exposed for about 45 seconds using the Douthitt Option X Exposure Unit described above. The visible radiation emitted by this source is suppressed by a UV light transmitting, visible light absorbing Kokomo ® glass filter (No. 400, Kokomo Opalescent Glass Co., Kokomo, Ind.). Each master is mounted on the corresponding color module drum, in a position assuring image registration of the four images as they are sequentially transferred from each master to the receiving paper. The leading edge clamps are also used to ground the photosensitive aluminized backplane to the drum. The masters are stretched by spring loading the trailing edge assuring that each lays flat against its drum.

Each module comprised a charging scorotron at 3 o'clock position, a developing station at 6 o'clock, a metering station at 7 o'clock and a cleaning station at 9 o'clock. The charging, developing, and metering procedure is similar to that described above. The transfer station consists of a tackdown roll, a transfer corona, paper loading, and a positioning device that fixes the relative position of paper and master in all four transfer operations.

In the preparation of the four-color proof the four developers, or toners, have the following compositions:

| INGREDIENTS | AMOUNT (g) |
|---|---|
| BLACK | |
| Copolymer of ethylene (89%) and methacrylic acid (11%), melt index at 190° C is 100, Acid No. is 66 | 2,193.04 |
| Sterling NF carbon black | 527.44 |
| Heucophthal Blue, G XBT-583D Heubach, Inc., Newark, NJ | 27.76 |
| Basic Barium Petronate ®, Witco Corp., New York, NY | 97.16 |
| Aluminum tristearate, Witco 132 Witco Corp., New York, NY | 27.76 |
| Isopar ®-L, non-polar liquid having a Kauri-Butanol value of 27, Exxon Corporation | 188,670.00 |
| CYAN | |
| Copolymer of ethylene (89%) and methacrylic acid (11%), melt index at 190° C. is 100, Acid No. is 66 | 3,444.50 |
| Ciba-Geigy Monarch Blue X3627 | 616.75 |
| Dalamar ® Yellow YT-858D Heubach, Inc., Newark, NJ | 6.225 |
| Aluminum tristearate, as described in black developer | 83.00 |
| Basic Barium Petronate ® (Witco Corp.) | 311.25 |
| Isopar ®-L as described in black developer | 293,000.00 |
| MAGENTA | |
| Copolymer of ethylene (89%) and methacrylic acid (11%), melt index at 190° C. is 100, Acid No. is 66 | 4,380.51 |
| Mobay RV-6700, Mobay Chemical Corp., Haledon, NJ | 750.08 |
| Mobay RV-6713, Mobay Chemical Corp. Haledon, NJ | 750.08 |
| Aluminum tristearate, as described in black developer | 120.014 |
| Triisopropanol amine | 75.008 |
| Basic Barium Petronate ® (Witco Corp.) | 720.08 |
| Isopar ®-L as described in black developer | 446,270.00 |

-continued

| INGREDIENTS | AMOUNT (g) |
|---|---|
| YELLOW | |
| Copolymer of ethylene (89%) and methacrylic acid (11%), melt index at 190° C. is 100, Acid No. is 66 | 1,824.75 |
| Yellow 14 polyethylene flush, Sun Chemical Co., Cincinnati, OH | 508.32 |
| Aluminum tristearate, as described in black developer | 46.88 |
| Basic Barium Petronate ® (Witco Corp.) | 59.50 |
| Isopar ®-L as described in black developer | 160,190.00 |

First, the cyan master is charged, developed and metered. The transfer station is positioned and the toned cyan image transferred onto the paper. After the cyan transfer is completed, the magenta master is corona charged, developed and metered, and the magenta image transferred, in registry, on top of the cyan image. Afterwards, the yellow master is corona charged, developed, and metered, and the yellow image is transferred on top of the two previous images. Finally the black master is corona charged, developed, metered, and the toned black image transferred, in registry, on top of the three previously transferred images. After the procedure is completed, the paper is carefully removed from the transfer station and the image fused for 15 seconds at 175° C.

The parameters used for preparation of the proof are: drum speed, 2.2 inches/second (5.588 cm/second); grid scorotron voltage, 100 to 400 V; scorotron current 200 to 1000 microAmps (5.11 to 6.04 kV); metering roll voltage, 20 to 200 V; tackdown roll voltage, −1.5 to −5.0 kV; transfer corona current, 50 to 150 microAmps (4.35 to 4.88 kV); metering roll speed, 4 to 8 inches/-second (10.16 to 20.32 cm/second.); metering roll gap, 0.002 to 0.005 inch (0.051 to 0.127 mm); developer conductivity 12 to 30 picomhos/cm; developer concentration, 1 to 2% solids.

The photosensitive composition is described in Example 1. After the solution is stirred for 24 hours to properly dissolve all the components, it is coated onto aluminized polyethylene terephthalate at 150 ft/min (45.7 m/min) coating speed. Coating weight is about 130 mg/dm$^2$. The material thus formed is cut into four pieces about 30 inch by 40 inch (76.2 cm by 101.6 cm) for preparation of a four color proof.

A four color proof is obtained by following the general procedure for making a four color proof outlined above using cyan, magenta, yellow and black photosensitive masters.

This example illustrates the use of the photosensitive electrostatic master to prepare a four color proof.

EXAMPLE 5

Four compositions were prepared which contained poly(methyl methacrylate) as a co-binder, either benzophenone or triglycerol benzoate as plasticizer, and Initiator IN2 as shown in Table 2 below. Each contained a different amount of poly(tetrahydropyranyl methacrylate) (Polymer H) as the acid forming binder. These were coated onto aluminized polyester film base and exposed and tested as described in Example 3. The compositions, charge decay and imagewise exposure data are provided in Table 2 below.

TABLE 2

FORMULATIONS AND CHARGE DECAY FOR EXAMPLE 5
COMPOSITION

| # | POLYMER 1 | % | ACID FORMING POLYMER | % | INIT (IN) | % | PLASTICIZER | % |
|---|---|---|---|---|---|---|---|---|
| 1 | PMMA | 42 | poly(THPMA) | 42 | 2 | 0.4 | BP | 15.6 |
| 2 | PMMA | 60 | poly(THPMA) | 24 | 2 | 0.4 | BP | 15.6 |
| 3 | PMMA | 74 | poly(THPMA) | 10 | 2 | 0.4 | BP | 15.6 |
| 4 | PMMA | 42 | poly(THPMA) | 42 | 2 | 0.4 | GTB | 15.6 |
| 5 | PMMA | 42 | poly(THPMA) | 42 | 4 | 1.3 | BP | 15.6 |

| # | EXP Mj | % RH | T °F. | $V_0$ | $V_5$ | $V_{10}$ | $V_{15}$ | $V_{60}$ | EXP mj/cm$^2$ | IMAGEWISE EXPOSURE HIGH-LIGHT DOTS % | SHADOW DOTS % |
|---|---|---|---|---|---|---|---|---|---|---|---|
| 1 | NONE | 50 | 70 | 484 | 457 | 445 | 434 | 371 | 50 | 3 | 99.5 |
|   | 100 | 50 | 70 | 2 | 0 | | | | | | |
| 2 | NONE | 50 | 70 | 469 | 445 | 432 | 421 | 397 | 50 | 1 | 99.0 |
|   | 100 | 50 | 70 | 43 | 11 | 5 | 2 | 0 | | | |
| 3 | NONE | 50 | 70 | 521 | 492 | 474 | 459 | 428 | 100 | 1 | 98.0 |
|   | 100 | 50 | 70 | 215 | 105 | 61 | 40 | 14 | | | |
| 4 | NONE | 50 | 70 | 500 | 482 | 474 | 468 | 458 | | | |
|   | 100 | 50 | 70 | 36 | 11 | 6 | 4 | 3 | | | |
| 5 | NONE | 35 | 70 | 351 | 341 | 336 | 333 | 328 | | | |
|   | 100 | 35 | 70 | 61 | 33 | 21 | 16 | 9 | | | |

EXAMPLE 6

Two compositions were prepared containing poly(-methyl methacrylate) as the binder and Initiator IN2. Each had a different amount of the bistetrahydropyranyl ester of phthalic acid as the acid forming plasticizer as shown in Table 3 below. These were coated onto aluminized polyethylene terephthalate film and exposed and tested as described in Example 1. The compositions, charge decay, and image data are contained in Table 3 below.

TABLE 3

FORMULATIONS AND CHARGE DECAY FOR EXAMPLE 6
COMPOSITION

| POLYMER | ACID FORMING |
|---|---|

TABLE 3-continued
FORMULATIONS AND CHARGE DECAY FOR EXAMPLE 6
COMPOSITION

| # | BINDER | % | INIT (IN) | % | PLASTICIZER | % |
|---|--------|----|-----------|----|-------------|----|
| 1 | PMMA | 58 | 2 | 0.4 | bis-THP Phthalate | 41.6 |
| 2 | PMMA | 67 | 2 | 0.4 | bis-THP Phthalate | 31.6 |

| EXP # | EXP Mj | % RH | T °F. | $V_0$ | $V_5$ | $V_{10}$ | $V_{15}$ | $V_{60}$ | IMAGEWISE EXPOSURE EXP mj/cm$^2$ | HIGH-LIGHT DOTS % | SHADOW DOTS % |
|-------|--------|------|-------|----|----|----|----|----|---------|---------|---------|
| 1 | NONE | 50 | 72 | 105 | 52 | 36 | 27 | 13 | | | |
|   | 100  | 50 | 72 | 0 | | | | | | | |
| 2 | NONE | 50 | 72 | 143 | 62 | 38 | 29 | 18 | 10 | 0.5 | 98 |
|   | 100  | 50 | 72 | 0 | | | | | | | |

EXAMPLE 7

Two compositions were prepared which contained poly(methyl methacrylate) as the binder, Initiator IN2, and di-tert-butyl malonate or di-tert-butyl oxalate as the acid forming plasticizer as shown in Table 4 below. These were coated onto aluminized polyester and exposed and tested as described in Example 1. The composition, charge decay, and image data are contained in Table 4 below. These elements were heated after exposure to develop the conductive image prior to toning.

TABLE 4
FORMULATIONS AND CHARGE DECAY FOR EXAMPLE 7
COMPOSITION

| # | POLYMER BINDER | % | INIT (IN) | % | ACID FORMING PLASTICIZER | % |
|---|----------------|----|-----------|----|------------------------|----|
| 1 | PMMA | 67.6 | 2 | 0.4 | DTBM | 32 |
| 2 | PMMA | 67.6 | 2 | 0.4 | DTBO | 32 |

| # | EXP Mj | HEAT/TIME | % RH | T °F. | $V_0$ | $V_5$ | $V_{10}$ | $V_{15}$ | $V_{60}$ |
|---|--------|-----------|------|-------|----|----|----|----|----|
| 1 | NONE | | 20 | 72 | 242 | 154 | 101 | 72 | 35 |
|   | 100  | 80° C./10 min | 20 | 72 | 18 | 3 | 2 | 1 | 0 |
| 2 | NONE | 80° C./10 min | 20 | 72 | 120 | 44 | 20 | 12 | 5 |
|   | 100  | 80° C./10 min | 20 | 72 | 46 | 22 | 15 | 12 | 8 |

| # | EXP mj/cm$^2$ | HEAT/TIME | HIGHLIGHT DOTS | SHADOW DOTS |
|---|---------------|-----------|----------------|-------------|
| 1 | 55 | 60° C./5 MIN | 0.5% | 99% |

EXAMPLE 8

A composition was prepared which contained polyt-ert-butyl acrylate, 97.5%, (obtained from Monomer Polymer Laboratories, Trevose, Pa.) and 2.5% Initiator IN2 dissolved in a mixture of methylene chloride and methyl isobutyl ketone. This was coated onto aluminized polyethylene terephthalate film and exposed and tested as described in Example 3. The charge decay data are shown in Table 5 below.

TABLE 5

| EXP Mj | HEAT/TIME | % RH | T °F. | $V_0$ | $V_5$ | $V_{10}$ | $V_{15}$ | $V_{60}$ |
|--------|-----------|------|-------|----|----|----|----|----|
| 0 | 80° C./10 min | 38 | 70 | 286 | 280 | 278 | 275 | 268 |
| 100 | 80° C./10 min | 20 | 72 | 112 | 68 | 46 | 34 | 18 |

Control

Two photosensitive elements were prepared as described in Example 1 from the compositions described below. The data from charge decay experiments on exposed and unexposed samples of these coatings, run as previously described, are also recorded in Table 6 below.

| INGREDIENTS[1] | A | B |
|----------------|------|------|
| PMMA | 5 | 4.25 |
| Dioctyl-phthalate | 2.25 | 3.0 |
| Benzoin Tosylate | 0.36 | 0.35 |
| Methylene chloride | 28 | 30 |

[1]the weight of all ingredients is in grams

TABLE 6

| COATING | Exp Mj | % RH | T °F. | $V_0$ | $V_{5s}$ | $V_{10s}$ | $V_{15s}$ |
|---------|--------|------|-------|----|-----|------|------|
| A | None | 50 | 72 | 323 | 303 | 293 | 280 |
|   | 100  | 50 | 72 | 313 | 294 | 276 | 258 |
|   | 500  | 50 | 72 | 239 | 150 | 105 | 78 |
| B | None | 38 | 68 | 186 | 176 | 168 | 160 |
|   | 100  | 38 | 68 | 220 | 200 | 188 | 173 |
|   | 500  | 38 | 68 | 184 | 113 | 70 | 43 |

We claim:

1. A high resolution, photosensitive electrostatic master which upon imagewise exposure to actinic radiation forms conductive exposed image areas, the photosensitive electrostatic master comprising an electrically conductive substrate bearing a layer of a photosensitive composition consisting essentially of at least one acid labile ester compound which decomposes to form acid having a pKa of about 5 or less, and a photoinitiator or photoinitiating system which upon exposure generates a strong acid to catalyze the decomposition of the at least one acid labile ester compound, wherein the electrical conductivity of the photosensitive composition in the exposed image areas is increased.

2. A photosensitive electrostatic master according to claim 1 wherein the photosensitive composition also contains either a polymeric binder, a compatible plasticizer, or a combination of the polymeric binder and compatible plasticizer thereof.

3. A photosensitive electrostatic master according to claim 2 wherein the photosensitive composition contains a colorant.

4. A photosensitive electrostatic master according to claim 1 wherein the polymer contains an acid labile ester selected from the group consisting of alpha-alkoxy alkyl esters, represented by the formula:

—CO$_2$—C (R$^1$) (OR$^2$)—CH(R$^3$) (R$^4$)

where:
R$^1$ is hydrogen or alkyl;
R$^2$ is alkyl; and
R$^3$ and R$^4$ are each independently hydrogen or alkyl and R$^1$ and R$^2$, R$^1$ and either R$^3$ or R$^4$, or R$^2$ and either R$^3$ or R$^4$ when taken together form a 5-, 6-, or 7-membered ring.

5. A photosensitive electrostatic master according to claim 4 wherein the acid labile polymer contains tetrahydropyranyl acrylate or tetrahydropyranyl methacrylate ester groups.

6. A photosensitive electrostatic master according to claim 4 wherein the acid labile polymer is a copolymer of benzyl methacrylate and tetrahydropyranyl methacrylate.

7. A photosensitive electrostatic master according to claim 4 wherein the acid labile polymer is a homopolymer of tetrahydropyranyl methacrylate.

8. A photosensitive electrostatic master according to claim 5 wherein the acid labile ester is selected from the group of secondary and tertiary alkyl esters, represented by the formula:

CO$_2$—C(R$^5$)R$^6$) (R$^7$)

where
R$^5$ is H, alkyl, alpha-beta unsaturated alkenyl, aryl, substituted aryl,
R$^6$ is H, alkyl, alkenyl, aryl, substituted aryl,
R$^7$ is alkyl, alkenyl, aryl, substituted aryl, R$^5$ and either R$^6$ or R$^7$, or R$^6$ with R$^7$ when taken together form a 5-, 6-, or 7-membered ring.

9. A photosensitive electrostatic master according to claim 8 wherein the acid labile polymer is poly(tertiarybutyl acrylate).

10. A photosensitive electrostatic master according to claim 5 wherein the acid labile ester is a silyl ester.

11. A photosensitive electrostatic master according to claim 5 wherein the polymer has an acid labile polyester backbone which decomposes to form acid.

12. A photosensitive electrostatic master according to claim 5 wherein the polymer contains acid labile ester crosslinks which decompose to form acid.

13. A photosensitive electrostatic master according to claim 1 where the acid forming initiator is selected from the group consisting of onium salts, ortho-nitrobenzyl esters of sulfonic acids, alpha-sulfonyloxy ketone, N-hydroxyimide sulfonates, N-hydroxyamide sulfonates, halogenated compounds, and aryl naphthoquinonediazide-4-sulfonates.

14. A photosensitive electrostatic master according to claim 13 wherein the acid forming initiator is a triarylsulfonium salt.

15. A photosensitive electrostatic master according to claim 13 wherein the acid forming initiator is 9-anthracenylpropyl diphenyl sulfonium hexafluoroantimonate.

16. A photosensitive electrostatic master according to claim 13 wherein the acid forming initiator is dibromotetrachloroethane.

17. A photosensitive electrostatic master according to claim 1 wherein the photosensitive composition contains a plasticizer or additive having at least one acid labile ester group in which the acid portion of the ester is selected from the group consisting of carboxylic, sulfonic, and sulfinic acids.

18. A photosensitive electrostatic master according to claim 17 wherein the plasticizer or additive contains at least one acid labile ester group selected from the group of alpha-alkoxy alkyl esters, represented by the formula:

—CO$_2$—C (R$^1$) (OR$^2$)—CH(R$^3$(R$^4$)

where:
R$^1$ is hydrogen or alkyl;
R$^2$is alkyl; and
R$^3$ and R$^4$ are each independently hydrogen or alkyl and R$^1$ and R$^2$, R$^1$ and either R$^3$or R$^4$, or R$^2$ and either R$^3$ or R$^4$ when taken together form a 5-, 6-, or 7-membered ring.

19. A photosensitive electrostatic master according to claim 17 wherein the plasticizer or additive contains at least one acid labile ester group selected from the group of secondary and tertiary alkyl esters, represented by the formula:

CO$_2$—C(R$^5$)R$^6$) (R$^7$)

where
R$^5$ is H, alkyl, alpha-beta unsaturated alkenyl, aryl, substituted aryl,
R$^6$ is H, alkyl, alkenyl, aryl, substituted aryl,
R$^7$ is alkyl, alkenyl, aryl, substituted aryl, R$^5$ and either R$^6$or R$^7$, or R$^6$ with R$^7$when taken together form a 5-, 6-, or 7-membered ring.

20. A photosensitive electrostatic master according to claim 19 wherein the plasticizer is di-tert-butyl malonate.

21. A photosensitive electrostatic master according to claim 17 wherein the acid labile ester group is a silyl ester.

22. A photosensitive electrostatic master according to claim 17 where the acid forming initiator is selected from the group consisting of onium salts, ortho-nitrobenzyl esters of sulfonic acids, alpha-sulfonyloxy ketones, N-hydroxyimide sulfonates, N-hydroxyamide sulfonates, halogenated compounds, and aryl naphthoquinonediazide-4-sulfonates.

* * * * *

UNITED STATES PATENT AND TRADEMARK OFFICE
CERTIFICATE OF CORRECTION

PATENT NO. : 5,120,629

DATED : June 9, 1992

INVENTOR(S) : Richard D. Bauer and Catherine T. Chang

It is certified that error appears in the above-identified patent and that said Letters Patent is hereby corrected as shown below:

Column 27, lines 1-13

Claim 1. A high resolution, photosensitive electrostatic master which upon imagewise exposure to actinic radiation forms conductive exposed image areas, the photosensitive electrostatic master comprising an electrically conductive substrate bearing a layer of a photosensitive composition consisting essentially of at least one acid labile compound which decomposes to form acid and a photoinitiator or photoinitiating system which upon exposure generates a strong acid to catalyze the decomposition of the at least one acid labile ester compound, wherein said at least one acid labile compound is an acrylic, vinyl, polyester or polyurethane polymer having at least one acid labile ester substituent in which the acid portion of the ester is selected from the group consisting of carboxylic, sulfonic, and sulfinic acids.

Column 28, lines 21-26

Claim 17. A high resolution, photosensitive electrostatic master which upon imagewise exposure to actinic radiation forms conductive exposed image areas, the photosensitive electrostatic master comprising an electrically conductive substrate bearing a layer of a photosensitive composition consisting essentially of at least one acid labile compound which decomposes to form acid and a photoinitiator or photoinitiating system which upon

UNITED STATES PATENT AND TRADEMARK OFFICE
CERTIFICATE OF CORRECTION

PATENT NO. : 5,120,629
DATED : June 9, 1992
INVENTOR(S) : Richard D. Bauer and Catherine T. Chang It is certified that error appears in the above-identified patent and that said Letters Patent is hereby corrected as shown below:

exposure generates a strong acid to catalyze the decomposition of the at least one acid labile ester compound, wherein the at least one acid labile compound is a plasticizer or additive having at least one acid labile ester group in which the acid portion of the ester is selected from the group consisting of carboxylic, sulfonic and sulfinic acids.

Col. 3, lines 49 & 50, change "acid labile and" to --an acid labile polyester which--

Col. 3, line 51, after "labile" insert --ester--

Col. 4, line 31, change "R=H or alkyl" to --R=alkyl--
Col. 27, lines 48, 65, and 67, change "claim 5" to --claim 1 --.
Col. 28, line 2, change "claim 5" to --claim 1 --.

Signed and Sealed this

Twenty-eighth Day of December, 1993

Attest:

BRUCE LEHMAN

*Attesting Officer*   *Commissioner of Patents and Trademarks*